US012088284B2

(12) United States Patent
Naik et al.

(10) Patent No.: US 12,088,284 B2
(45) Date of Patent: Sep. 10, 2024

(54) DISCRETE RELAY DRIVER CIRCUIT FOR PEAK AND HOLD OPERATION

(71) Applicant: Delphi Technologies IP Limited, St. Michael (BB)

(72) Inventors: Karthik Naik, Jalan Eunos (SG); Wong Chuan Ming, Tressure Crest (SG); Venkata Jaya Sai Praneeth Ammanamanchi, Lamadelaine (LU); Engel Joseph, Oberkorn (LU)

(73) Assignee: DELPHI TECHNOLOGIES IP LIMITED, Saint Michael (BB)

( * ) Notice: Subject to any disclaimer, the term of this patent is extended or adjusted under 35 U.S.C. 154(b) by 29 days.

(21) Appl. No.: 18/109,402

(22) Filed: Feb. 14, 2023

(65) Prior Publication Data

US 2024/0275372 A1    Aug. 15, 2024

(51) Int. Cl.
*H03K 17/06* (2006.01)
*H03K 17/0412* (2006.01)
*H03K 17/16* (2006.01)

(52) U.S. Cl.
CPC ..... *H03K 17/063* (2013.01); *H03K 17/04123* (2013.01); *H03K 17/165* (2013.01); *H03K 2217/0063* (2013.01); *H03K 2217/0072* (2013.01)

(58) Field of Classification Search
CPC .................................................. H03K 17/063

USPC ........................................................ 327/427
See application file for complete search history.

(56) References Cited

U.S. PATENT DOCUMENTS

| 10,135,269 B2 * | 11/2018 | Hasan ................. H03K 17/687 |
| 10,608,627 B2 | 3/2020 | Kodama |
| 10,958,155 B2 | 3/2021 | Ikeda |
| 11,025,244 B2 | 6/2021 | Yokosho |

FOREIGN PATENT DOCUMENTS

WO         2017157539 A1     9/2017

* cited by examiner

*Primary Examiner* — Tomi Skibinski
(74) *Attorney, Agent, or Firm* — Dickinson Wright PLLC

(57) ABSTRACT

A discrete relay driver circuit that includes a first high side gate drive circuit configured to drive a first high side MOSFET and a second high side gate drive circuit configured to drive a second high side MOSFET. The discrete relay driver circuit also includes a first resistor divider configured to sense voltage from the first high side MOSFET, a second resistor divider configured to sense voltage from the second high side MOSFET, and a first low side gate driver circuit configured to drive a first low side MOSFET. The discrete relay driver circuit also includes a second low side gate driver circuit configured to drive a second low side MOSFET based on a first low side enable signal, and a third low side gate driver circuit configured to drive a third low side MOSFET based on a second low side enable signal.

20 Claims, 6 Drawing Sheets

DISCRETE RELAY DRIVER CIRCUIT FOR PEAK AND HOLD OPERATION

TECHNICAL FIELD

This disclosure relates to vehicle, and in particular, to discrete relay driver circuits for peak and hold operations in one or more vehicle components.

BACKGROUND

Vehicles, such as cars, trucks, sport utility vehicles, crossovers, mini-vans, or other suitable vehicles, typically include various electric components, such as motors (e.g., permanent magnet motors or other suitable electric motors), batteries, battery chargers, and the like. Such electric components may be used for various aspects of vehicle control or operation, such as vehicle prolusion or other suitable aspects of vehicle control or operation.

Typically, such electronic components include one or more electromechanical relays that rely on a magnetic field generated from a current (e.g., associated with a control signal) being passed through a coil, which pulls a magnetic level to make a connection between separate electrical contacts. This type of relay may only activate when the magnetic field from the coil is strong enough. Accordingly, such an arrangement may require a driver circuit that can provide sufficient current to turn on the relays.

SUMMARY

This disclosure relates generally to discrete relay driver circuits.

An aspect of the disclosed embodiments includes a discrete relay driver circuit that includes a first high side gate drive circuit configured to drive a first high side metal-oxide-semiconductor field-effect transistor (MOSFET) based on a first voltage enable signal, and a second high side gate drive circuit configured to drive a second high side MOSFET based on a second voltage enable signal. The discrete relay driver circuit also includes a first resistor divider configured to sense voltage from the first high side MOSFET, a second resistor divider configured to sense voltage from the second high side MOSFET, and a first low side gate driver circuit configured to drive a first low side MOSFET based on a power factor correction enable signal. The discrete relay driver circuit also includes a second low side gate driver circuit configured to drive a second low side MOSFET based on a first low side enable signal, and a third low side gate driver circuit configured to drive a third low side MOSFET based on a second low side enable signal.

Another aspect of the disclosed embodiments includes an electronic circuit that includes a first high side gate drive circuit configured to drive a first high side MOSFET based on a first voltage enable signal, a second high side gate drive circuit configured to drive a second high side MOSFET based on a second voltage enable signal, and a first resistor divider configured to sense voltage from the first high side MOSFET. The electronic circuit also includes a second resistor divider configured to sense voltage from the second high side MOSFET, and a first low side gate driver circuit configured to drive a first low side MOSFET based on a power factor correction enable signal. The first low side MOSFET is electrically connected to a relay. The electronic circuit also includes a second low side gate driver circuit configured to drive a second low side MOSFET based on a first low side enable signal, the second low side MOSFET being electrically connected to a first low side relay, and a third low side gate driver circuit configured to drive a third low side MOSFET based on a second low side enable signal. The third low side MOSFET is electrically connected to a second low side relay. The electronic circuit also includes a shunt resistor electrically connected to the first low side MOSFET, the second low side MOSFET, and the third low side MOSFET on a first side of the shunt resistor and electrically connected to ground on a second side of the shunt resistor.

Another aspect of the disclosed embodiments includes a system that includes a microcontroller configured to generate a first voltage enable signal, a second voltage enable signal, a power factor correction enable signal, a first low side enable signal, and a second low side enable signal. The system also includes a first high side gate drive circuit configured to drive a first high side MOSFET based on the first voltage enable signal, a second high side gate drive circuit configured to drive a second high side MOSFET based on the second voltage enable signal, a first resistor divider configured to sense voltage from the first high side MOSFET, a second resistor divider configured to sense voltage from the second high side MOSFET, and a first low side gate driver circuit configured to drive a first low side MOSFET based on the power factor correction enable signal. The first low side MOSFET is electrically connected to a relay. The system also includes a second low side gate driver circuit configured to drive a second low side MOSFET based on the first low side enable signal. The second low side MOSFET is electrically connected to a first low side relay. The system also includes a third low side gate driver circuit configured to drive a third low side MOSFET based on the second low side enable signal. The third low side MOSFET is electrically connected to a second low side relay. The system also includes a shunt resistor electrically connected to the first low side MOSFET, the second low side MOSFET, and the third low side MOSFET on a first side of the shunt resistor and electrically connected to ground on a second side of the shunt resistor. The system also includes a current sensing amplifier electrically connected to the shunt resistor on a first side of the current sensing amplifier and configured to: sense a current flowing through at least one of the first low side MOSFET, the second low side MOSFET, and the third low side MOSFET; and provide, to the microcontroller, a low side feedback signal based on the sensed current, wherein the microcontroller selectively controls the first low side MOSFET, the second low side MOSFET, and the third low side MOSFET based on the low side feedback signal.

These and other aspects of the present disclosure are provided in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, vehicles, such as cars, trucks, sport utility vehicles, cross-overs, mini-vans, or other suitable vehicles, typically include various electric components, such as motors (e.g., permanent magnet motors or other suitable electric motors), batteries, battery chargers, and the like. Such electric components may be used for various aspects of vehicle control or operation, such as vehicle prolusion or other suitable aspects of vehicle control or operation.

Figure 3:
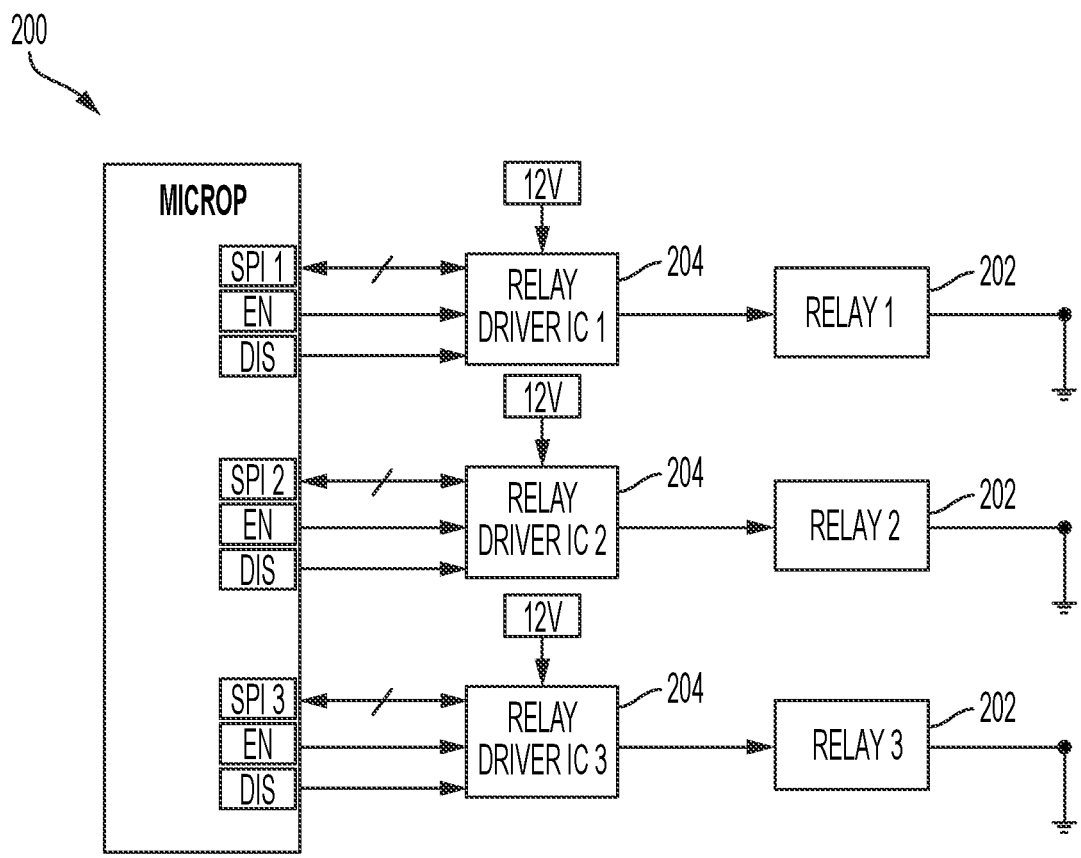
FIG. 3 generally illustrates a circuit according to the prior art.
Figure 4:
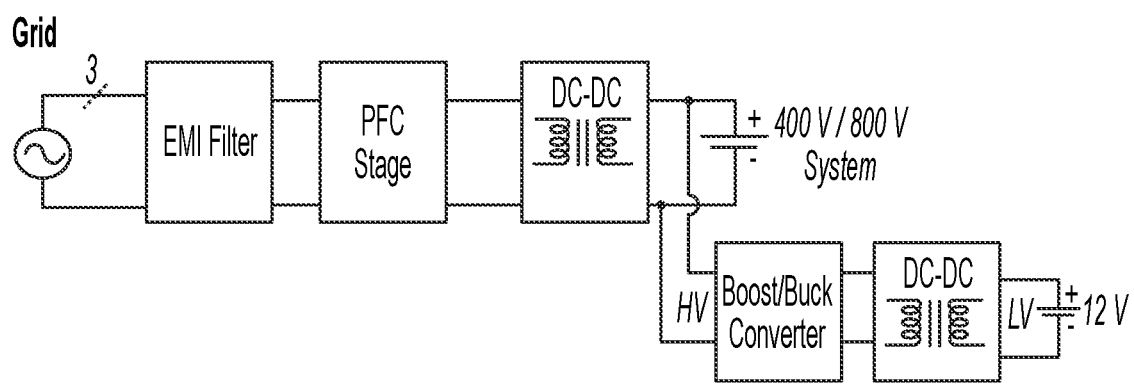
FIG. 4 generally illustrates a power converter circuit according to the principles of the present disclosure.

Typically, such electronic components include one or more electromechanical relays that rely on a magnetic field generated from a current (e.g., associated with a control signal) being passed through a coil, which pulls a magnetic level to make a connection between separate electrical contacts. This type of relay may only activate when the magnetic field from the coil is strong enough. As is generally illustrated in FIG. 3, such a circuit 200 may use a driver circuit that can provide sufficient current to turn on relays 202. There are separate driver integrated chips (ICs) 204 to drive each respective relay 202. Separate serial peripheral interface (SPI) signals are used to control each driver IC's 204 to turn on the respective relays 202. FIG. 4 generally illustrates an example circuit (e.g., a 22 kilowatt charger (PFC+CLLLC Converter)) for receiving power (e.g., from an electrical grid), converting the power (e.g., from alternating current (AC) to direct current (DC) and/or DC to AC), and providing power to a load, such as a battery of a vehicle.

However, such circuits do not provide for peak and/or hold functions. Further, separate relay driver ICs may increase overall design cost. Accordingly, systems and methods, such as those described herein, configured to provide a discrete relay driver circuit for peak and hold operation, may be desirable. In some embodiments, the systems and methods described herein may be configured to provide a discrete relay driver circuit that includes a first high side gate drive circuit configured to drive a first high side metal-oxide-semiconductor field-effect transistor (MOSFET) based on a first voltage enable signal. The systems and methods described herein may be configured to provide a second high side gate drive circuit configured to drive a second high side MOSFET based on a second voltage enable signal.

The systems and methods described herein may be configured to provide a first resistor divider configured to sense voltage from the first high side MOSFET and, a second resistor divider configured to sense voltage from the second high side MOSFET. The systems and methods described herein may be configured to provide a first low side gate driver circuit configured to drive a first low side MOSFET based on a power factor correction enable signal, a second low side gate driver circuit configured to drive a second low side MOSFET based on a first low side enable signal, and a third low side gate driver circuit configured to drive a third low side MOSFET based on a second low side enable signal.

In some embodiments, the first voltage enable signal corresponds to 12 volts and the second voltage enable signal corresponds to 24 volts. In some embodiments, a microcontroller may generate the first voltage enable signal, the second voltage enable signal, the power factor correction enable signal, the first low side enable signal, and the second low side enable signal.

The systems and methods described herein may be configured to provide a first diode that may be electrically connected to the first high side MOSFET on a first side of the first diode and electrically connected to the first low side MOSFET, the second low side MOSFET, and the third low side MOSFET on a second side of the first diode. A second diode may be electrically connected to the second high side MOSFET on a first side of the second diode and electrically connected to the first low side MOSFET, the second low side MOSFET, and the third low side MOSFET on a second side of the second diode. The systems and methods described herein may be configured to provide a shunt resistor that may be electrically connected to the first low side MOSFET, the second low side MOSFET, and the third low side MOSFET on a first side of the shunt resistor and electrically connected to ground on a second side of the shunt resistor.

The systems and methods described herein may be configured to provide a current sensing amplifier that may be electrically connected to the shunt resistor on a first side of the current sensing amplifier. The current sensing amplifier may be configured to sense a current flowing through at least one of the first low side MOSFET, the second low side MOSFET, and the third low side MOSFET. Additionally, or alternatively, the current sensing amplifier may be configured to provide a low side feedback signal based on the sensed current. In some embodiments, the first low side MOSFET, the second low side MOSFET, and the third low side MOSFET may be selectively controllable based on the low side feedback signal.

Figure 1:
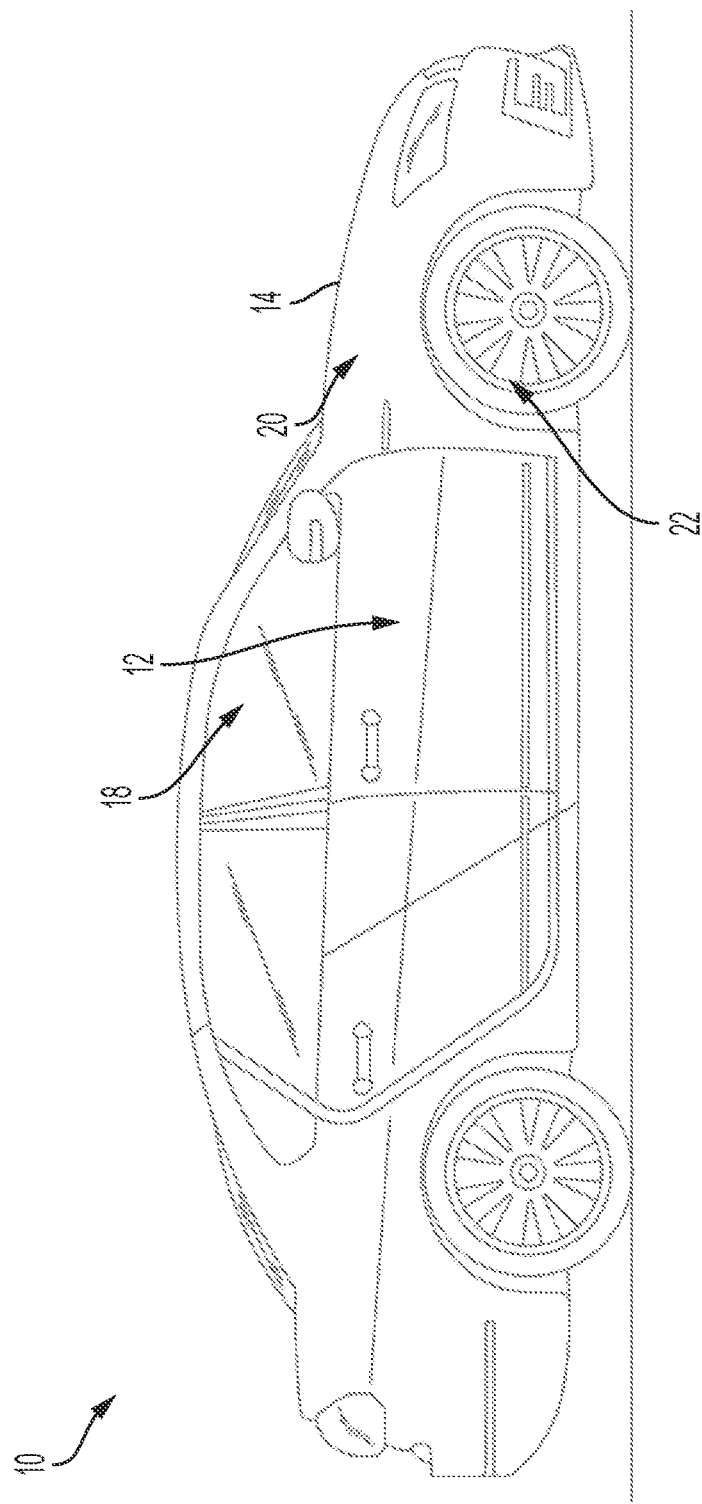
FIG. 1 generally illustrates a vehicle according to the principles of the present disclosure.

FIG. 1 generally illustrates a vehicle 10 according to the principles of the present disclosure. The vehicle 10 may include any suitable vehicle, such as a car, a truck, a sport utility vehicle, a mini-van, a cross-over, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles. The vehicle 10 includes a vehicle body 12 and a hood 14. A portion of the vehicle body 12 defines a passenger compartment 18. Another portion of the vehicle body 12 defines the engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position.

The passenger compartment 18 is disposed rearward of the engine compartment 20. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system. In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a steering wheel, and other such components are disposed in the passenger compartment 18 of the vehicle 10. The propulsion controls may be actuated or controlled by a driver of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer (e.g., drive by wire) which in turn may control the corresponding propulsion component of the propulsion system.

In some embodiments, the vehicle 10 includes a transmission in communication with a crankshaft via a flywheel or clutch or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force, which is translated through the transmission to one or more axles which turns wheels 22. When the vehicle 10 includes one or more electric motors, a vehicle battery and/or fuel cell provides energy to the electric motors to turn the wheels 22. In cases where the vehicle 10 includes a vehicle battery to provide energy to the one or more electric motors, when the battery is depleted, it may be connected to an electric grid (e.g., using a wall socket) to recharge the battery cells. Additionally, or alternatively, the vehicle 10 may employ regenerative braking which uses the one or more electric motors of the vehicle 10 as a generator to convert kinetic energy lost due to decelerating back into stored energy in the battery.

The vehicle 10 may include automatic vehicle propulsion systems, such as a cruise control, an adaptive cruise control, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

Figure 2:
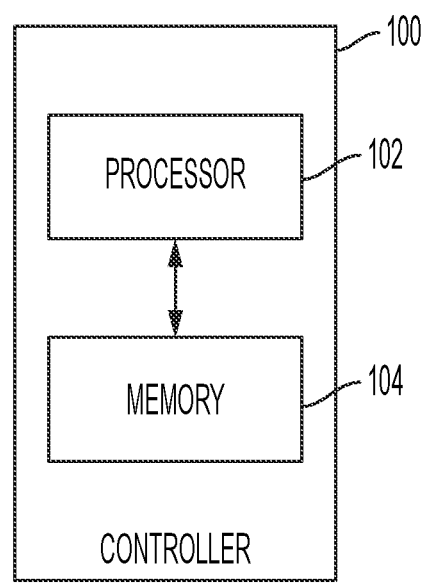
FIG. 2 generally illustrates a controller according to the principles of the present disclosure.

In some embodiments, the vehicle 10 may include a controller, such as controller 100, as is generally illustrated in FIG. 2. The controller 100 may include any suitable controller, such as an electronic control unit or other suitable controller. The controller 100 may be configured to control, for example, the various functions of the steering system and/or various functions of the vehicle 10. The controller 100 may include a processor 102 and a memory 104. The processor 102 may include any suitable processor, such as those described herein. Additionally, or alternatively, the controller 100 may include any suitable number of processors, in addition to or other than the processor 102. The memory 104 may comprise a single disk or a plurality of disks (e.g., hard drives), and includes a storage management module that manages one or more partitions within the memory 104. In some embodiments, memory 104 may include flash memory, semiconductor (solid state) memory or the like. The memory 104 may include Random Access Memory (RAM), a Read-Only Memory (ROM), or a combination thereof. The memory 104 may include instructions that, when executed by the processor 102, cause the processor 102 to, at least, control various aspects of the vehicle 10 and/or perform various aspects of the systems and methods described herein.

Figure 5:
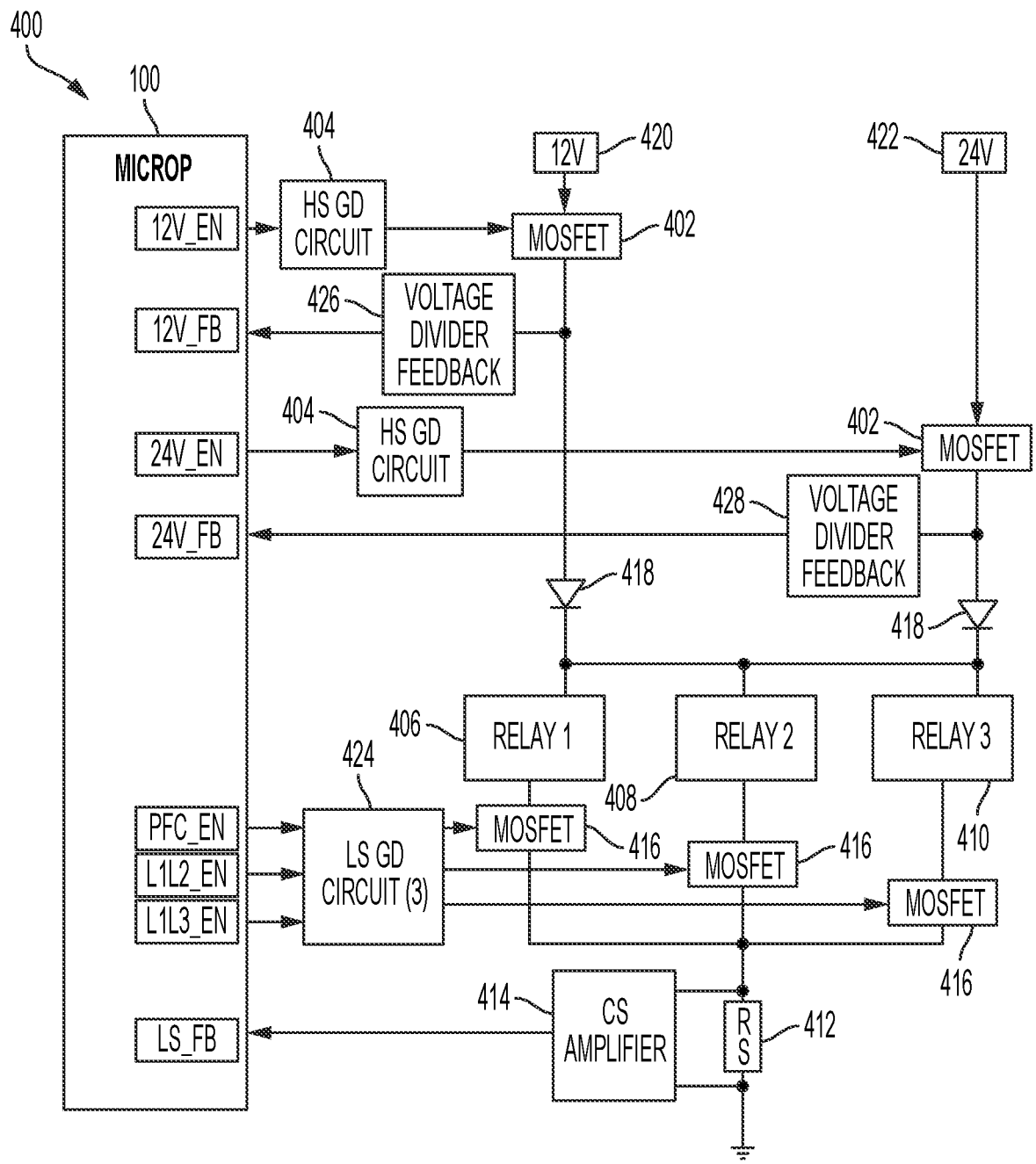
FIG. 5 generally illustrates a discrete relay driver circuit for peak and hold operation according to the principles of the present disclosure.

As is generally illustrated in FIG. 5, a discrete relay driver circuit 400 may include a microcontroller, such as the controller 100. The controller 100 may be configured to selectively control one or more high Side (HS) MOSFETs 402 for 12V and 24V to switch between the peak phase (24V) and hold phase (12V). Two high side gate drive (HS GD) circuits 404 drive the MOSFETs 402 to provide 24V and 12V to one or more of a relay 406 (e.g., relay 1), a first low side relay 408 (e.g., relay 2), and a second low side relay 410 (e.g., relay 3) during peak phase and hold phase respectively. The controller 100 may generate a 12V enable signal (12V_EN) and may control the MOSFETs 402, using the 12V_EN signal to enable the 12V line 420 during a hold condition. Additionally, or alternatively, the controller 100 may generate a 24V enable signal (24V_EN) and may control the MOSFETs 402, using the 24V_EN signal to enable the 24V line 422 during a peak condition.

A shunt resistor (RS) 412 and a current sense (CS) amplifier 414 may be configured to sense the current flowing through the circuit 400. The shunt resistor 412 and the CS amplifier 414 may comprise a resistor divider network which may be used to sense the voltage which will be connected to the relay 406, the relay 408, and/or the relay 410 (e.g., which may provide 12V or 24V depending on whether the circuit 400 is in the peak phase or the hold phase). The controller 100 may protect the circuit 400 from various conditions, such as over current conditions, short circuit conditions, under voltage conditions, and/or over voltage conditions. For example, the CS amplifier 414 may generate a feedback signal (LS_FB) based on the sensed current. The controller 100 may control (e.g., turn on or off) one or more low side (LS) MOSFETS 416 and/or the HS MOSFETs 402 based on the LS_FB signal using one or more of the relay 406, the relay 408, and the relay 410. For example, a short in the circuit 400 may will lead to a relatively high current flowing through the circuit 400. The controller 100 may use the feedback provided by the CS amplifier 414 to turn off the LS MOSFETs 416 or HS MOSFETs 402 to protect the circuit 400.

The controller 100 may generate a power factor correction signal (PFC_EN) to turn on one or more of the LS MOSFETs 416 using the relay 406. Additionally, or alternatively, the controller 100 may generate a LIL2 enable signal (LIL2_EN) to turn on one or more LS MOSFETs 416 using the relay 408. Additionally, or alternatively, the controller 100 may generate a LIL3 enable signal (L1L3_EN) to turn on one or more LS MOSFETs 416 using the relay 410. In some embodiments, a diode 418 may be connected to the 12V line 420 and another diode 418 may be connected to the 24V line 422 to isolate the 12V line 420 from the 24V line 422 (e.g., which may avoid a reverse power flow condition). The diodes 418 may be further connected to each of the relay 406, the relay 408, and the relay 410. The LS MOSFETs 416 may be connected on the other side of the relay 406, the relay 408, and the relay 410. The LS MOSFETs 416 may be driver, individual, by corresponding low side gate drive (LS GD) circuits 424. This arrangement may reduce resources and printed circuit board space.

A voltage divider feedback network 426 may be connected to the HS MOSFET 402 on the 12V line 420. The voltage divider feedback network 426 may sense the voltage at the HS MOSFET 402 on the 12V line 420 and may provide a 12V feedback signal (12V_FB) to the controller 100 based on the sensed voltage. Additionally, or alternatively, a voltage divider feedback network 428 may be connected to the HS MOSFET 402 on the 24V line 422. The voltage divider feedback network 428 may sense the voltage at the HS MOSFET 402 on the 24V line 422 and may provide a 24V feedback signal (24V_FB) to the controller 100 based on the sensed voltage.

Figure 6:
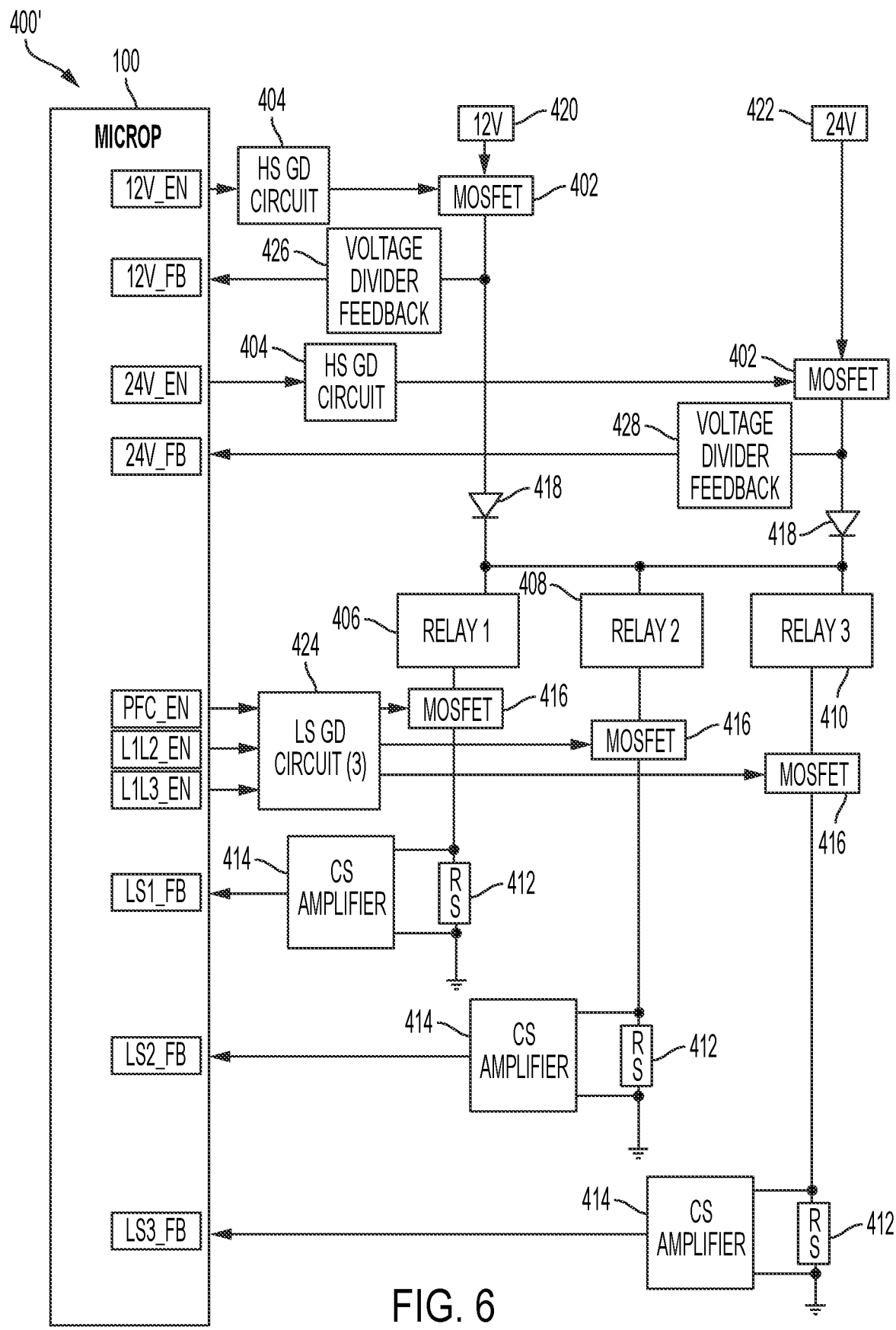
FIG. 6 generally illustrates an alternative discrete relay driver circuit for peak and hold operation according to the principles of the present disclosure.

FIG. 6, generally illustrates an alternative discrete relay driver circuit 400'. The circuit 400' may include features similar to the circuit 400 and/or different from the circuit 400. For example, the circuit 400' may include a shunt resistor 412 and a CS amplifier 414 on each of the LS MOSFETs 416. For example, a first shunt resistor 412 and a first CS amplifier 414 may be configured to generate a first feedback signal (LS1_FB) based on current sensed at the LS MOSFET 416 connected to the relay 406. Additionally, or alternatively, a second shunt resistor 412 and a second CS amplifier 414 may be configured to generate a second feedback signal (LS2_FB) based on current sensed at the LS MOSFET 416 connected to the relay 408. Additionally, or alternatively, a third shunt resistor 412 and a third CS amplifier 414 may be configured to generate a third feedback signal (LS3_FB) based on current sensed at the LS MOSFET 416 connected to the relay 410.

In some embodiments, a discrete relay driver circuit includes a first high side gate drive circuit configured to drive a first high side metal-oxide semiconductor field-effect transistor (MOSFET) based on a first voltage enable signal, and a second high side gate drive circuit configured to drive a second high side MOSFET based on a second voltage enable signal. The discrete relay driver circuit also includes a first resistor divider configured to sense voltage from the first high side MOSFET, a second resistor divider configured to sense voltage from the second high side MOSFET, and a first low side gate driver circuit configured to drive a first low side MOSFET based on a power factor correction enable signal. The discrete relay driver circuit also includes a second low side gate driver circuit configured to drive a second low side MOSFET based on a first low side enable signal, and a third low side gate driver circuit configured to drive a third low side MOSFET based on a second low side enable signal.

In some embodiments, the first voltage enable signal corresponds to 12 volts. In some embodiments, the second voltage enable signal corresponds to 24 volts. In some embodiments, a microcontroller generates the first voltage enable signal, the second voltage enable signal, the power factor correction enable signal, the first low side enable signal, and the second low side enable signal. In some embodiments, the discrete relay driver circuit also includes a first diode electrically connected to the first high side MOSFET on a first side of the first diode and electrically connected to the first low side MOSFET, the second low side MOSFET, and the third low side MOSFET on a second side of the first diode. In some embodiments, the discrete relay driver circuit also includes a second diode electrically connected to the second high side MOSFET on a first side of the second diode and electrically connected to the first low side MOSFET, the second low side MOSFET, and the third low side MOSFET on a second side of the second diode. In some embodiments, the discrete relay driver circuit also includes a shunt resistor electrically connected to the first low side MOSFET, the second low side MOSFET, and the third low side MOSFET on a first side of the shunt resistor and electrically connected to ground on a second side of the shunt resistor. In some embodiments, the discrete relay driver circuit also includes a current sensing amplifier electrically connected to the shunt resistor on a first side of the current sensing amplifier. In some embodiments, the current sensing amplifier is configured to sense a current flowing through at least one of the first low side MOSFET, the second low side MOSFET, and the third low side MOSFET. In some embodiments, the current sensing amplifier is configured to provide a low side feedback signal based on the sensed current. In some embodiments, the first low side MOSFET, the second low side MOSFET, and the third low side MOSFET are selectively controllable based on the low side feedback signal. In some embodiments, the first low side MOSFET is electrically connected to a relay. In some embodiments, the second low side MOSFET is electrically connected to a first low side relay. In some embodiments, the third low side MOSFET is electrically connected to a second low side relay.

In some embodiments, an electronic circuit includes a first high side gate drive circuit configured to drive a first high side metal-oxide-semiconductor field-effect transistor (MOSFET) based on a first voltage enable signal, a second high side gate drive circuit configured to drive a second high side MOSFET based on a second voltage enable signal, and a first resistor divider configured to sense voltage from the first high side MOSFET. The electronic circuit also includes a second resistor divider configured to sense voltage from the second high side MOSFET, and a first low side gate driver circuit configured to drive a first low side MOSFET based on a power factor correction enable signal. The first low side MOSFET is electrically connected to a relay. The electronic circuit also includes a second low side gate driver circuit configured to drive a second low side MOSFET based on a first low side enable signal, the second low side MOSFET being electrically connected to a first low side relay, and a third low side gate driver circuit configured to drive a third low side MOSFET based on a second low side enable signal. The third low side MOSFET is electrically connected to a second low side relay. The electronic circuit also includes a shunt resistor electrically connected to the first low side MOSFET, the second low side MOSFET, and the third low side MOSFET on a first side of the shunt resistor and electrically connected to ground on a second side of the shunt resistor.

In some embodiments, the electronic circuit also includes a current sensing amplifier electrically connected to the shunt resistor on a first side of the current sensing amplifier. In some embodiments, the current sensing amplifier is configured to sense a current flowing through at least one of the first low side MOSFET, the second low side MOSFET, and the third low side MOSFET. In some embodiments, the current sensing amplifier is configured to provide a low side feedback signal based on the sensed current. In some embodiments, the first low side MOSFET, the second low side MOSFET, and the third low side MOSFET are selectively controllable based on the low side feedback signal.

In some embodiments, a system includes a microcontroller configured to generate a first voltage enable signal, a second voltage enable signal, a power factor correction enable signal, a first low side enable signal, and a second low side enable signal. The system also includes a first high side gate drive circuit configured to drive a first high side metal-oxide semiconductor field-effect transistor (MOSFET) based on the first voltage enable signal, a second high side gate drive circuit configured to drive a second high side MOSFET based on the second voltage enable signal, a first resistor divider configured to sense voltage from the first high side MOSFET, a second resistor divider configured to sense voltage from the second high side MOSFET, and a first low side gate driver circuit configured to drive a first low side MOSFET based on the power factor correction enable signal. The first low side MOSFET is electrically connected to a relay. The system also includes a second low side gate driver circuit configured to drive a second low side MOSFET based on the first low side enable signal. The second low side MOSFET is electrically connected to a first low side relay. The system also includes a third low side gate driver circuit configured to drive a third low side MOSFET based on the second low side enable signal. The third low side MOSFET is electrically connected to a second low side relay. The system also includes a shunt resistor electrically connected to the first low side MOSFET, the second low side MOSFET, and the third low side MOSFET on a first side of the shunt resistor and electrically connected to ground on a second side of the shunt resistor. The system also includes a current sensing amplifier electrically connected to the shunt resistor on a first side of the current sensing amplifier and configured to: sense a current flowing through at least one of the first low side MOSFET, the second low side MOSFET, and the third low side MOSFET; and provide, to the microcontroller, a low side feedback signal based on the sensed current, wherein the microcontroller selectively controls the first low side MOSFET, the second low side MOSFET, and the third low side MOSFET based on the low side feedback signal.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations of the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described to allow easy understanding of the present disclosure and do not limit the present disclosure. On the contrary, the disclosure is intended to cover various modifications and equivalent arrangements included within the scope of the appended claims, which scope is to be accorded the broadest interpretation to encompass all such modifications and equivalent structure as is permitted under the law.

What is claimed is:

1. A discrete relay driver circuit comprising:
a first high side gate drive circuit configured to drive a first high side metal-oxide-semiconductor field-effect transistor (MOSFET) based on a first voltage enable signal;
a second high side gate drive circuit configured to drive a second high side MOSFET based on a second voltage enable signal;
a first resistor divider configured to sense voltage from the first high side MOSFET;
a second resistor divider configured to sense voltage from the second high side MOSFET;
a first low side gate driver circuit configured to drive a first low side MOSFET based on a power factor correction enable signal;
a second low side gate driver circuit configured to drive a second low side MOSFET based on a first low side enable signal; and
a third low side gate driver circuit configured to drive a third low side MOSFET based on a second low side enable signal.

2. The discrete relay driver circuit of claim 1, wherein the first voltage enable signal corresponds to 12 volts.

3. The discrete relay driver circuit of claim 1, wherein the second voltage enable signal corresponds to 24 volts.

4. The discrete relay driver circuit of claim 1, wherein a microcontroller generates the first voltage enable signal, the second voltage enable signal, the power factor correction enable signal, the first low side enable signal, and the second low side enable signal.

5. The discrete relay driver circuit of claim 1, further comprising a first diode electrically connected to the first high side MOSFET on a first side of the first diode and electrically connected to the first low side MOSFET, the second low side MOSFET, and the third low side MOSFET on a second side of the first diode.

6. The discrete relay driver circuit of claim 1, further comprising a second diode electrically connected to the second high side MOSFET on a first side of the second diode and electrically connected to the first low side MOSFET, the second low side MOSFET, and the third low side MOSFET on a second side of the second diode.

7. The discrete relay driver circuit of claim 1, further comprising a shunt resistor electrically connected to the first low side MOSFET, the second low side MOSFET, and the third low side MOSFET on a first side of the shunt resistor and electrically connected to ground on a second side of the shunt resistor.

8. The discrete relay driver circuit of claim 7, further comprising a current sensing amplifier electrically connected to the shunt resistor on a first side of the current sensing amplifier.

9. The discrete relay driver circuit of claim 8, wherein the current sensing amplifier is configured to sense a current flowing through at least one of the first low side MOSFET, the second low side MOSFET, and the third low side MOSFET.

10. The discrete relay driver circuit of claim 9, wherein the current sensing amplifier is configured to provide a low side feedback signal based on the sensed current.

11. The discrete relay driver circuit of claim 10, wherein the first low side MOSFET, the second low side MOSFET, and the third low side MOSFET are selectively controllable based on the low side feedback signal.

12. The discrete relay driver circuit of claim 1, wherein the first low side MOSFET is electrically connected to a relay.

13. The discrete relay driver circuit of claim 1, wherein the second low side MOSFET is electrically connected to a first low side relay.

14. The discrete relay driver circuit of claim 1, wherein the third low side MOSFET is electrically connected to a second low side relay.

15. An electronic circuit comprising:
a first high side gate drive circuit configured to drive a first high side metal-oxide-semiconductor field-effect transistor (MOSFET) based on a first voltage enable signal;
a second high side gate drive circuit configured to drive a second high side MOSFET based on a second voltage enable signal;
a first resistor divider configured to sense voltage from the first high side MOSFET;
a second resistor divider configured to sense voltage from the second high side MOSFET;
a first low side gate driver circuit configured to drive a first low side MOSFET based on a power factor correction enable signal, the first low side MOSFET being electrically connected to a relay;
a second low side gate driver circuit configured to drive a second low side MOSFET based on a first low side enable signal, the second low side MOSFET being electrically connected to a first low side relay;
a third low side gate driver circuit configured to drive a third low side MOSFET based on a second low side enable signal, the third low side MOSFET being electrically connected to a second low side relay; and
a shunt resistor electrically connected to the first low side MOSFET, the second low side MOSFET, and the third low side MOSFET on a first side of the shunt resistor and electrically connected to ground on a second side of the shunt resistor.

16. The electronic circuit of claim 15, further comprising a current sensing amplifier electrically connected to the shunt resistor on a first side of the current sensing amplifier.

17. The electronic circuit of claim 16, wherein the current sensing amplifier is configured to sense a current flowing through at least one of the first low side MOSFET, the second low side MOSFET, and the third low side MOSFET.

18. The electronic circuit of claim 17, wherein the current sensing amplifier is configured to provide a low side feedback signal based on the sensed current.

19. The electronic circuit of claim 18, wherein the first low side MOSFET, the second low side MOSFET, and the third low side MOSFET are selectively controllable based on the low side feedback signal.

20. A system comprising:
a microcontroller configured to generate a first voltage enable signal, a second voltage enable signal, a power factor correction enable signal, a first low side enable signal, and a second low side enable signal;
a first high side gate drive circuit configured to drive a first high side metal-oxide-semiconductor field-effect transistor (MOSFET) based on the first voltage enable signal;
a second high side gate drive circuit configured to drive a second high side MOSFET based on the second voltage enable signal;
a first resistor divider configured to sense voltage from the first high side MOSFET;
a second resistor divider configured to sense voltage from the second high side MOSFET;
a first low side gate driver circuit configured to drive a first low side MOSFET based on the power factor correction enable signal, the first low side MOSFET being electrically connected to a relay;
a second low side gate driver circuit configured to drive a second low side MOSFET based on the first low side enable signal, the second low side MOSFET being electrically connected to a first low side relay;
a third low side gate driver circuit configured to drive a third low side MOSFET based on the second low side enable signal, the third low side MOSFET being electrically connected to a second low side relay;
a shunt resistor electrically connected to the first low side MOSFET, the second low side MOSFET, and the third low side MOSFET on a first side of the shunt resistor and electrically connected to ground on a second side of the shunt resistor; and
a current sensing amplifier electrically connected to the shunt resistor on a first side of the current sensing amplifier and configured to:
sense a current flowing through at least one of the first low side MOSFET, the second low side MOSFET, and the third low side MOSFET; and provide, to the microcontroller, a low side feedback signal based on the sensed current, wherein the microcontroller selectively controls the first low side MOSFET, the second low side MOSFET, and the third low side MOSFET based on the low side feedback signal.

* * * * *